(12) United States Patent
Rockhill

(10) Patent No.: US 11,482,486 B2
(45) Date of Patent: Oct. 25, 2022

(54) LOW-IMPEDANCE BUS ASSEMBLIES AND APPARATUS INCLUDING THE SAME

(71) Applicant: Eaton Intelligent Power Limited, Dublin (IE)

(72) Inventor: Andrew A. Rockhill, Waukesha, WI (US)

(73) Assignee: Eaton Intelligent Power Limited, Dublin (IE)

( * ) Notice: Subject to any disclaimer, the term of this patent is extended or adjusted under 35 U.S.C. 154(b) by 358 days.

(21) Appl. No.: 16/797,039

(22) Filed: Feb. 21, 2020

(65) Prior Publication Data

US 2020/0273792 A1     Aug. 27, 2020

Related U.S. Application Data

(60) Provisional application No. 62/810,076, filed on Feb. 25, 2019.

(51) Int. Cl.
| | |
|---|---|
| H01L 23/50 | (2006.01) |
| H01L 23/367 | (2006.01) |
| H01L 29/739 | (2006.01) |
| H01R 25/16 | (2006.01) |
| H02G 5/00 | (2006.01) |
| H01L 25/11 | (2006.01) |
| H01L 23/64 | (2006.01) |

(52) U.S. Cl.
CPC ............ *H01L 23/50* (2013.01); *H01L 23/367* (2013.01); *H01L 23/645* (2013.01); *H01L 25/115* (2013.01); *H01L 29/7393* (2013.01); *H01R 25/162* (2013.01); *H02G 5/005* (2013.01); *H02G 5/007* (2013.01)

(58) Field of Classification Search
CPC ...... H02G 5/005; H02G 5/007; H01L 23/367; H01L 23/50; H01L 23/645; H01L 25/115; H01L 29/7393; H01R 25/162
See application file for complete search history.

(56) References Cited

U.S. PATENT DOCUMENTS

| | | | | |
|---|---|---|---|---|
| 3,609,215 A | * | 9/1971 | Giger, Jr. ............... | H02G 5/007 174/88 B |
| 2001/0027872 A1 | * | 10/2001 | Wagener .................. | H02G 5/00 174/71 B |
| 2008/0024959 A1 | * | 1/2008 | Keegan .................. | H02G 5/005 361/677 |
| 2019/0006831 A1 | | 1/2019 | She et al. | |

FOREIGN PATENT DOCUMENTS

| | | |
|---|---|---|
| CN | 204349816 | 5/2015 |
| JP | 2005160248 | 6/2005 |

OTHER PUBLICATIONS

International Search Report and Written Opinion; PCT/EP2020/025089; dated Apr. 8, 2020; 5 pages.

* cited by examiner

*Primary Examiner* — Allan R Wilson
(74) *Attorney, Agent, or Firm* — Stanek Lemon Crouse & Meeks, P.A.

(57) ABSTRACT

A bus assembly includes a planar first bus, a second bus including a first planar bus section on the first bus and a second planar bus section connected to the first planar bus section and offset from the first planar bus section, and a third bus comprising a third planar bus section disposed between the first bus and the second planar bus section, and a fourth planar bus section connected to the third planar bus section, offset from third planar bus section, and disposed on the first planar bus section.

18 Claims, 8 Drawing Sheets

LOW-IMPEDANCE BUS ASSEMBLIES AND APPARATUS INCLUDING THE SAME

CROSS-REFERENCE TO RELATED APPLICATION

The present application claims priority to U.S. Provisional Patent Application No. 62/810,076; filed Feb. 25, 2019 entitled LOW-IMPEDANCE BUS ASSEMBLY.

STATEMENT OF GOVERNMENT INTEREST

This invention was made with government support under Contract N00014-14-C-0123 awarded by the Office of Naval Research. The government has certain rights in the invention.

BACKGROUND

The inventive subject matter relates to electrical power apparatus and methods and, more particularly, to bus assemblies for use with semiconductor switching devices.

Power electronics apparatus, such as power converters, solid-state circuit breakers and the like, may employ power transistors or other power semiconductor switching devices. Development of semiconductor technology has led to power semiconductor switching devices having dramatically increased voltage and switching frequency capabilities. For example, silicon carbide (SiC) transistors (e.g., SiC MOSFETs) have been developed capable of operating at frequencies that are multiples of operating frequencies of corresponding conventional silicon-based power devices (e.g., silicon IGBTs).

With the advent of such devices, impedance effects associated with conductive buses and other circuit components used with these devices have increased in significance. In particular, inductance and capacitance associated with such components may degrade system performance by introducing oscillation and other negative effects.

SUMMARY

Some embodiments of the inventive subject matter provide a bus assembly including a planar first bus, a second bus including a first planar bus section on the first bus and a second planar bus section connected to the first planar bus section and offset from the first planar bus section, and a third bus comprising a third planar bus section disposed between the first bus and the second planar bus section, and a fourth planar bus section connected to the third planar bus section, offset from third planar bus section, and disposed on the first planar bus section. In some embodiments, the second bus has a first slot between the first and second planar bus sections and an adjacent first connecting portion that connects the first and second planar bus sections and the third bus has a second slot between the third and fourth planar bus sections and an adjacent second connecting portion that connects the third and fourth planar bus sections. The first connecting portion may pass through the second slot and the second connecting portion may pass through the first slot. The first slot, the second slot, the first connecting portions and the second connecting portion may be aligned with a line bisecting the first bus.

In some embodiments, the first planar bus section and the second planar bus section may include respective conductive plates oriented in respective offset parallel planes, and the third planar bus section and the fourth planar bus section may include respective conductive plates oriented in respective offset parallel planes.

In further embodiments, the first bus may be configured to be disposed on a planar array of transistor packages and to electrically interconnect first terminals of the transistor packages and may have clearance holes that coincide with second terminals of the transistor packages. The first planar bus section may be configured to electrically interconnect the second terminals of a first group of the transistor packages and may have clearance holes that coincide with the first terminals of the first group of transistor packages. The second planar bus section may have clearance holes that coincide with first and second terminals of a second group of the transistor packages. The third planar bus section may have clearance holes that coincide with the first and second terminals of the first group of transistor packages. The fourth planar bus section may be configured to electrically interconnect the second terminals of the second group of transistor packages and may have clearance holes that coincide with the first terminals of the second group of transistor packages.

In further embodiments, the bus assembly may include connection tabs extending perpendicularly from edges of the first, second, third and fourth planar bus sections. First connection tabs extending from a first edge of the first planar bus assembly may be offset with respect to second connection tabs extending from a first edge of the fourth planar bus section aligned with the first edge of the first planar bus section. Third connection tabs extending from a first edge of the second planar bus section may be offset with respect to fourth connection tabs extending from a first edge of the third planar bus section aligned with the first edge of the second planar bus section.

Some embodiments provide an apparatus including a planar array of semiconductor device packages and a planar first bus disposed on the array of semiconductor device packages, electrically interconnecting first terminals of the semiconductor device packages, and having clearance holes that coincide with second terminals of the semiconductor device packages. The apparatus also includes a second bus comprising a first planar bus section on the first bus, electrically interconnecting the second terminals of a first group of the semiconductor device packages, and having clearance holes that coincide with the first terminals of the first group of semiconductor device packages and a second planar bus section electrically connected to the first planar bus section, offset from the first planar bus section, and having clearance holes that coincide with first and second terminals of a second group of the semiconductor device packages. The apparatus further includes a third bus including a third planar bus section disposed between the first bus and the second planar bus section and having clearance holes that coincide with the first and second terminals of the first group of semiconductor device packages and a fourth planar bus section electrically connected to the third planar bus section, disposed on the first planar bus section, electrically interconnecting the second terminals of the second group of semiconductor device packages, and having clearance holes that coincide with the first terminals of the second group of semiconductor device packages.

In some embodiments, each of the semiconductor device packages may include three transistors, three first terminals and three second terminals. In some embodiments, each of the semiconductor device packages may include at least one insulated gate bipolar transistor (IGBT). The first terminals may include emitter terminals and the second terminals may include collector terminals.

The apparatus may further include a cooling plate on which the semiconductor device packages are mounted.

The apparatus may also include connection tabs extending perpendicularly from the first, second, third and fourth planar bus sections. At least one metal oxide varistor (MOV) may be disposed on the first, second and third buses and connected between ones of the connection tabs connected to the second terminals of the first group of semiconductor device packages and ones of the second terminals of the second group of semiconductor device packages.

DETAILED DESCRIPTION

Figure 1:
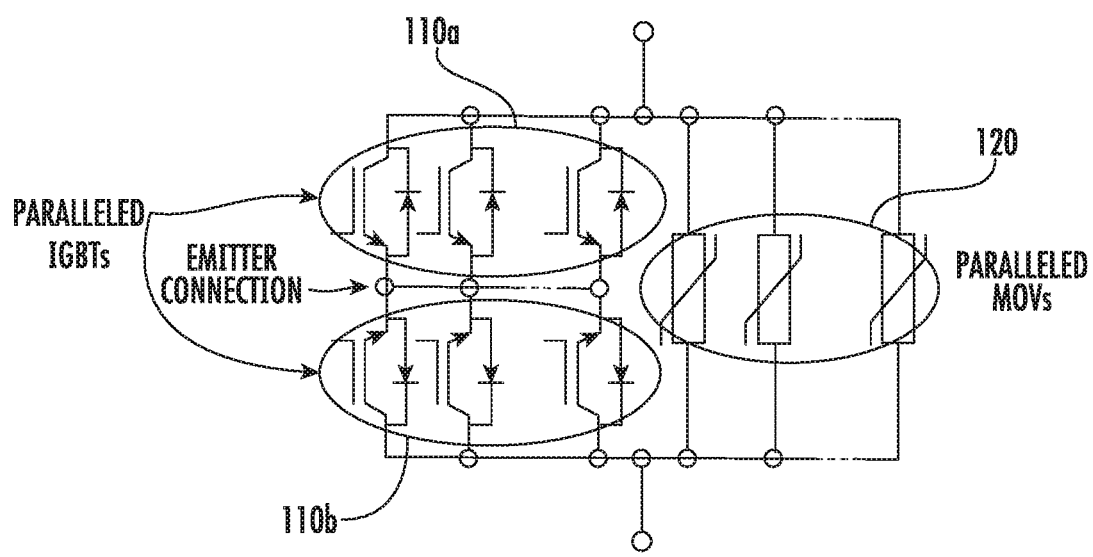
FIG. 1 is a schematic diagram of a power module according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

FIG. 1 is a circuit diagram for a power module according to some embodiments. The module includes two groups 110a, 110b of parallel-connected insulated gate bipolar transistors (IGBTs) connected in series. A group 120 of parallel-connected metal oxide varistors (MOVs) are connected in parallel with the series-connected groups 110a, 110b of IGBTS. Side, perspective, and top views of such a module 200 are provided in FIGS. 6-9. FIGS. 2-5 show components of a bus assembly for such a module.

Figure 2:
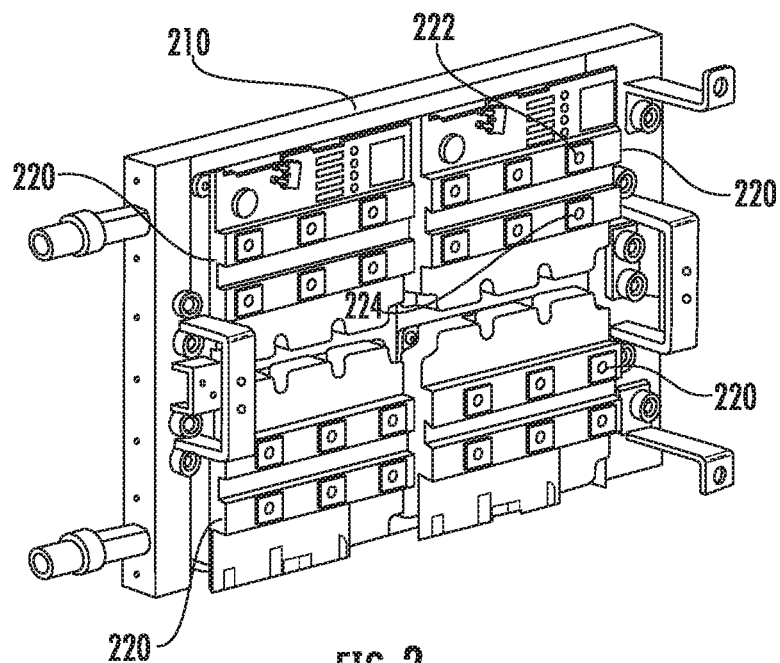
FIGS. 2-7 are views of components of a power module according to some embodiments.
Figure 3:
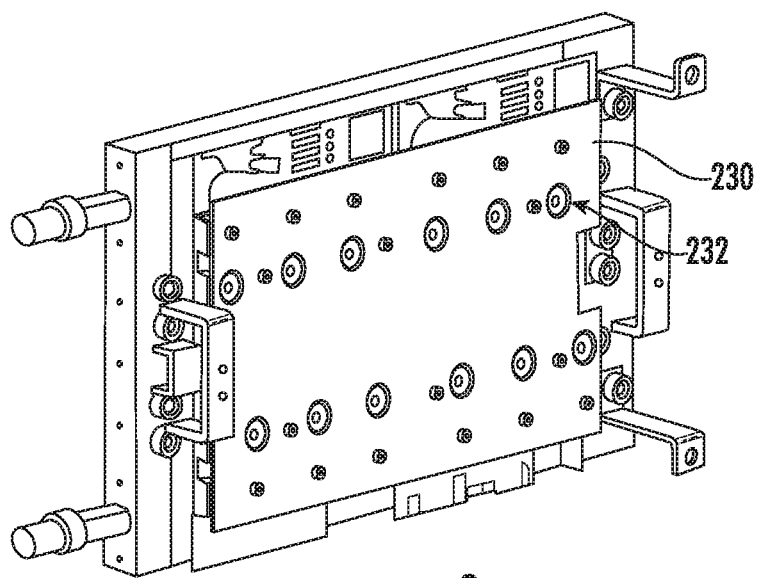

Referring to FIG. 2, the module includes multiple IGBT packages 220 mounted in a planar array on a cold plate 210. Each of the IGBT packages 220 includes three IGBTs and has three emitter terminals 222 and three collector terminals 224. As illustrated, the IGBT packages 220 are arranged such that the uppermost IGBT packages 220 have their emitter terminals 22 above their collector terminals 224 and the lowermost IGBT packages 220 have their emitter terminals 222 below their collector terminals 224. Referring to FIG. 3, an emitter bus bar 230 electrically connects the emitter terminals 222 of the IGBT packages 220 to one another, providing the connectivity indicated by the circled region of the schematic shown in FIG. 1. The emitter bus bar 230 is generally planar and has clearance holes 232 therein that expose the collector terminals 224 of the underlying IGBT packages 220.

Figure 4:
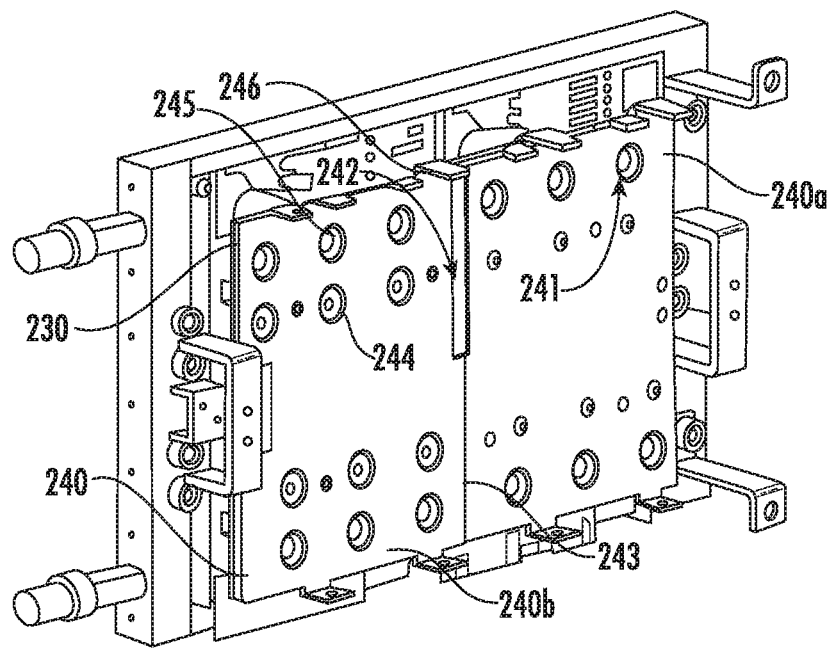

Referring to FIG. 4, a first collector bus bar 240 overlies the emitter bus bar 230. The first collector bus bar 240 includes first and second planar portions 240a, 240b that are on different planes. A cleft or slot 242 partially separates the first and second portions 240a, 240b, which remain connected by a connecting step portion 243. The first portion 240a interconnects the collector terminals 224 of the rightmost two IGBT packages 220 and has clearance holes 241 therein that coincide with the underlying connections of the first bus bar 230 to the emitter terminals 222 of the IGBT packages 220. The second portion 240b of the first collector bus bar 240 has first clearance holes 244 that coincide with the collector terminals 224 of the leftmost two IGBT packages 220, and second clearance holes 245 that coincide with the connections of the emitter bus bar 230 to the emitter terminals 222 of the leftmost two IGBT packages 220. The first collector bus bar 240 further includes tab-like connection terminals 246 that extend perpendicularly from the first and second planar portions 240a, 240b and facilitate connection of the first collector bus bar 240 to MOVs, as described below with reference to FIGS. 6 and 7.

Figure 5:
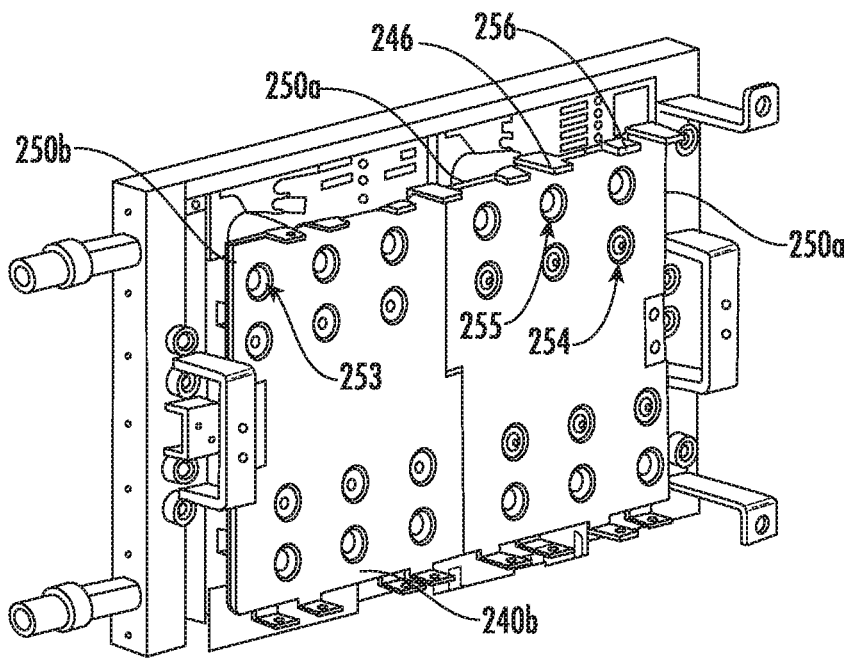

Referring to FIG. 5, a second collector bus bar 250 is interleaved with the first collector bus bar 240. The second collector bus bar 250 has a first portion 250a that overlaps the first portion 240a of the first collector bus bar 240 and a second portion 250b that is overlapped by the second portion 240b of the first collector bus bar 240. As illustrated, the second collector bus bar 250 is identical to the first collector bus bar 240 but is rotated 180 degrees with respect to the first collector bus bar 240 such that the first and second collector bus bars 240, 250 may be interleaved. The first portion 250a of the second collector bus bar 250 has first clearance holes 254 that coincide with the collector terminal connections to the first portion 240a of the first collector bus bar 240, and second clearance holes 255 that coincide with the emitter terminal connections of the right-side IGBT packages 220 to the emitter bus bar 230. The second portion 250b of the second collector bus bar 250 interconnects the collector terminals 224 of left-side IGBT packages 220 and has clearance holes 253 that coincide with the connections of the emitter bus 230 to the emitter terminals 222 of the left-side IGBT packages 220. The second collector bus bar 250 further includes tab-like connection terminals 256 that extend perpendicularly from the first and second portions 250a, 250b and facilitate connection of MOVs to the second collector bus bar 250, as described below with reference to FIGS. 6 and 7.

Figure 6:
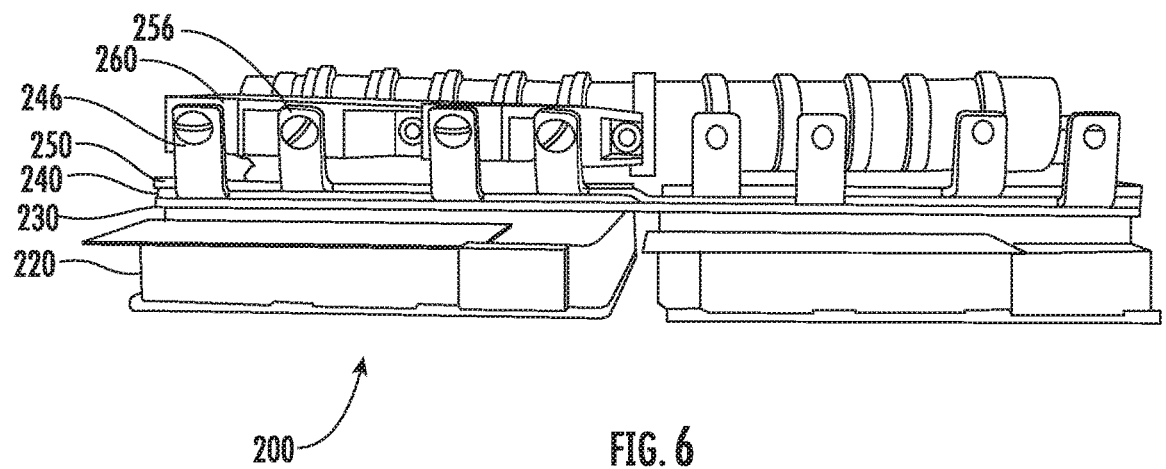
Figure 7:
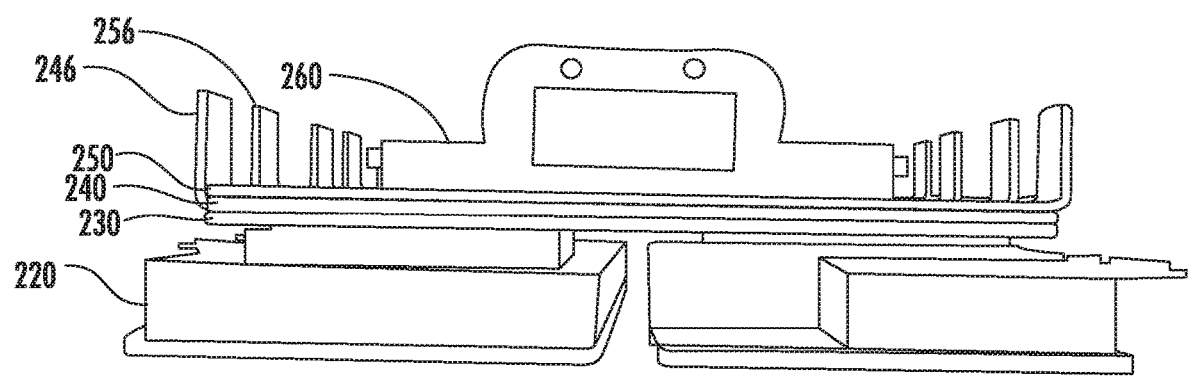
Figure 16:
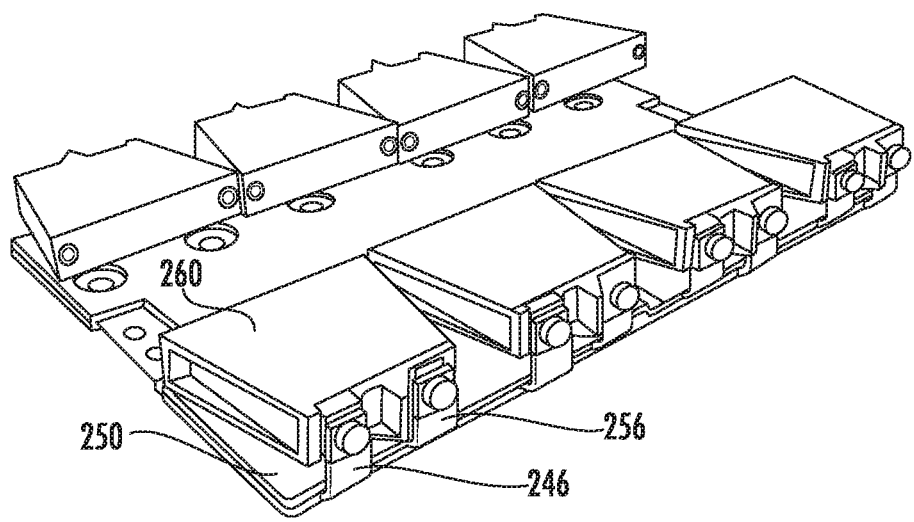
FIG. 16 is a perspective view illustrating MOV connections for the power module of FIGS. 2-7.

FIGS. 6 and 7 provide side views of an assembled module 200, including the structures described above with reference to FIGS. 2-5, along with MOVs 260 attached to the terminals 246, 256 of the first and second collector bus bars 240, 250. FIG. 16 is a detailed perspective view of the MOV connections. As illustrated, the emitter bus bar 230 and the first and second collector bus bars 240, 250 may be coated with an insulating material to prevent shorting between the bus bars 230, 240, 250. In some embodiments, insulating material layers may be provided between the bus bars 230, 240, 250 to provide similar insulating effects.

It will be understood that FIGS. 1-8 illustrate a configuration that can be used for a bidirectional module, and that some embodiments may be implemented as a unidirectional embodiment wherein one of IGBT packages (e.g., IGBT package 110b) could be removed, with the MOVs being connected in parallel with the remaining IGBT package (e.g., IGBT package 110a). It will also be understood that other types of IGBT packages could be used.

Figure 8:
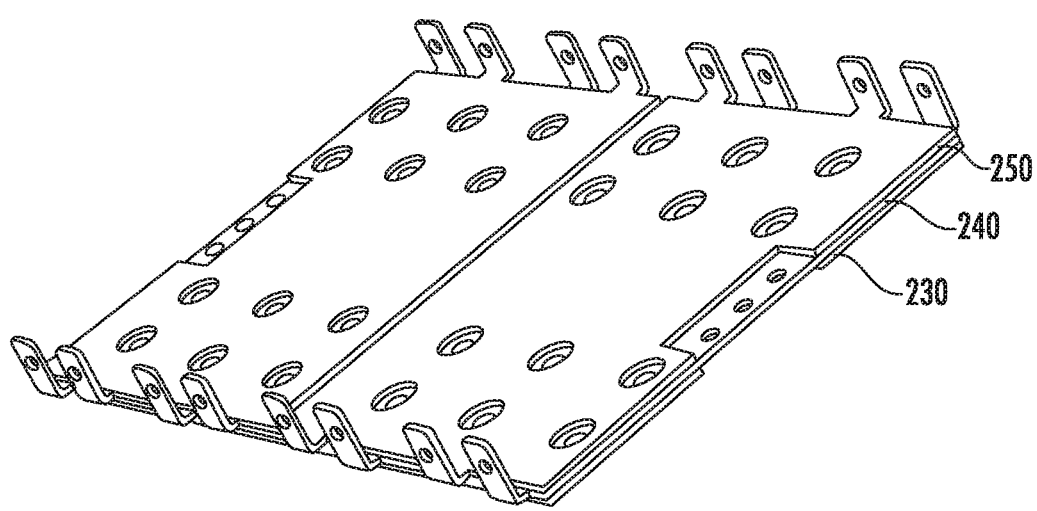
FIGS. 8-10 are views of a bus assembly for a power module according to some embodiments.
Figure 9:
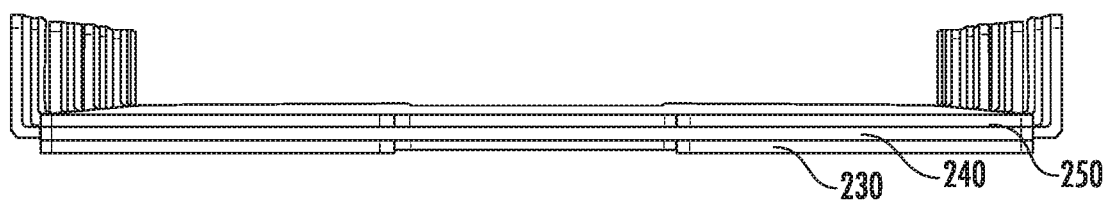
Figure 10:
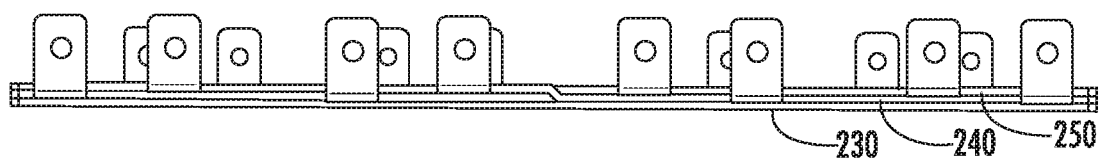
Figure 11:
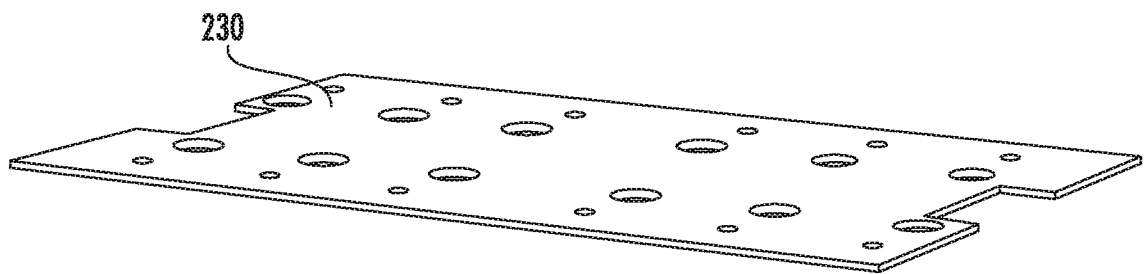
FIGS. 11-15 are isolated views of component bus bars of the bus assembly of FIGS. 8-10.
Figure 12:
Figure 13:
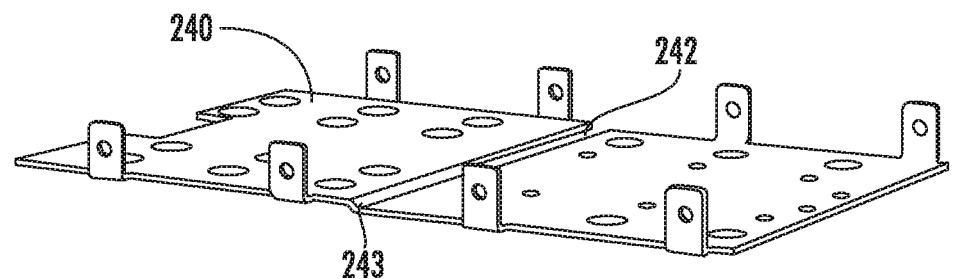
Figure 14:
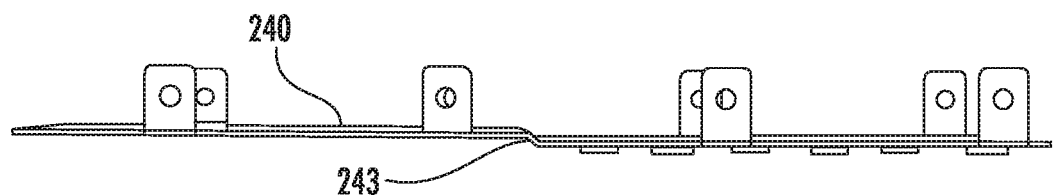
Figure 15:
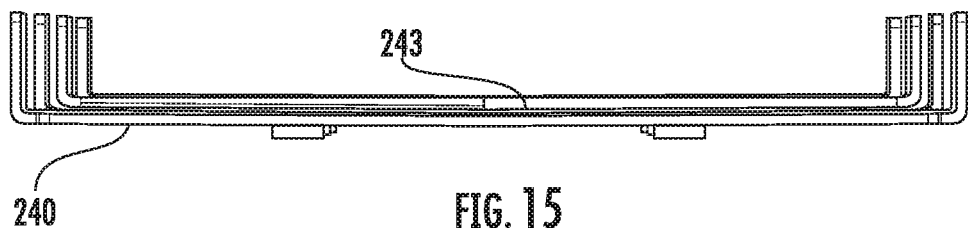

FIGS. 8-10 are isolated views of the bus bar assembly, illustrating relationships among the emitter bus bar 230 and the collector bus bars 240, 250. FIGS. 11 and 12 are isolated views of the emitter bus bar 230, illustrating that the emitter bus bar 230 may be generally planar. FIGS. 13-15 are isolated views of the first collector bus bar 240, illustrating the cleft 242 and step portion 243 that facilitate interleaving with the second collector bus bar 250 as described above. It will be understood that the second collector bus bar 250 may be identical to the first collector bus bar 240.

The drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. A bus assembly comprising:
a planar first bus;
a second bus comprising:
a first planar bus section on the first bus; and
a second planar bus section connected to the first planar bus section and offset from the first planar bus section;
a third bus comprising:
a third planar bus section disposed between the first bus and the second planar bus section; and
a fourth planar bus section connected to the third planar bus section, offset from third planar bus section, and disposed on the first planar bus section, wherein the second bus has a first slot between the first and second planar bus sections and an adjacent first connecting portion that connects the first and second planar bus sections, wherein the third bus has a second slot between the third and fourth planar bus sections and an adjacent second connecting portion that connects the third and fourth planar bus sections, wherein the first connecting portion passes through the second slot and wherein the second connecting portion passes through the first slot.

2. The bus assembly of claim 1, wherein the first slot, the second slot, the first connecting portions and the second connecting portion are aligned with a line bisecting the first bus.

3. The bus assembly of claim 1, wherein the first planar bus section and the second planar bus section comprise respective conductive plates oriented in respective offset parallel planes, and wherein the third planar bus section and the fourth planar bus section comprise respective conductive plates oriented in respective offset parallel planes.

4. A bus assembly comprising:
a planar first bus;
a second bus comprising:
a first planar bus section on the first bus; and
a second planar bus section connected to the first planar bus section and offset from the first planar bus section;
a third bus comprising:
a third planar bus section disposed between the first bus and the second planar bus section; and
a fourth planar bus section connected to the third planar bus section, offset from third planar bus section, and disposed on the first planar bus section,
wherein the first bus is configured to be disposed on a planar array of transistor packages and to electrically interconnect first terminals of the transistor packages and has clearance holes that coincide with second terminals of the transistor packages;
wherein the first planar bus section is configured to electrically interconnect the second terminals of a first group of the transistor packages and has clearance holes that coincide with the first terminals of the first group of transistor packages;
wherein the second planar bus section has clearance holes that coincide with first and second terminals of a second group of the transistor packages;
wherein the third planar bus section has clearance holes that coincide with the first and second terminals of the first group of transistor packages; and
wherein the fourth planar bus section is configured to electrically interconnect the second terminals of the second group of transistor packages and has clearance holes that coincide with the first terminals of the second group of transistor packages.

5. A bus assembly comprising:
a planar first bus;
a second bus comprising:
a first planar bus section on the first bus; and
a second planar bus section connected to the first planar bus section and offset from the first planar bus section on a plane parallel to the first planar bus section;
a third bus comprising: a third planar bus section disposed between the first bus and the second planar bus section;
a fourth planar bus section connected to the third planar bus section, offset from third planar bus section on a plane parallel to the third planar bus section, and disposed on the first planar bus section; and
further comprising connection tabs extending perpendicularly from edges of the first, second, third and fourth planar bus sections.

6. The bus assembly of claim 5, wherein first connection tabs extending from a first edge of the first planar bus assembly are offset with respect to second connection tabs extending from a first edge of the fourth planar bus section aligned with the first edge of the first planar bus section and wherein third connection tabs extending from a first edge of the second planar bus section are offset with respect to fourth connection tabs extending from a first edge of the third planar bus section aligned with the first edge of the second planar bus section.

7. An apparatus comprising:
a planar array of semiconductor device packages;
a planar first bus disposed on the array of semiconductor device packages, electrically interconnecting first terminals of the semiconductor device packages, and having clearance holes that coincide with second terminals of the semiconductor device packages;
a second bus comprising:
a first planar bus section on the first bus, electrically interconnecting the second terminals of a first group of the semiconductor device packages, and having clearance holes that coincide with the first terminals of the first group of semiconductor device packages; and
a second planar bus section electrically connected to the first planar bus section, offset from the first planar bus section, and having clearance holes that coincide with first and second terminals of a second group of the semiconductor device packages; and
a third bus comprising:
a third planar bus section disposed between the first bus and the second planar bus section and having clearance holes that coincide with the first and second terminals of the first group of semiconductor device packages; and
a fourth planar bus section electrically connected to the third planar bus section, disposed on the first planar bus section, electrically interconnecting the second terminals of the second group of semiconductor device packages, and having clearance holes that coincide with the first terminals of the second group of semiconductor device packages.

8. The apparatus of claim 7, wherein the second bus has a first slot between the first and second planar bus sections and an adjacent first connecting portion that connects the first and second planar bus sections, wherein the third bus has a second slot between the third and fourth planar bus sections and an adjacent second connecting portion that connects the third and fourth planar bus sections, wherein the first connecting portion passes through the second slot and wherein the second connecting portion passes through the first slot.

9. The apparatus of claim 8, wherein the first slot, the second slot, the first connecting portions and the second connecting portion are aligned with a line bisecting the first bus.

10. The apparatus of claim 8, wherein the first planar bus section and the second planar bus section comprise respective conductive plates oriented in respective offset parallel planes, and wherein the third planar bus section and the fourth planar bus section comprise respective conductive plates oriented in respective offset parallel planes.

11. The apparatus of claim 7, wherein each of the semiconductor device packages comprises three transistors, three first terminals and three second terminals.

12. The apparatus of claim 7, wherein each of the semiconductor device packages comprises at least one insulated gate bipolar transistor (IGBT), wherein the first terminals comprise emitter terminals and wherein the second terminals comprise collector terminals.

13. The apparatus of claim 12, wherein each of the semiconductor device packages comprises three IGBTs, three emitter terminals, and three collector terminals.

14. The apparatus of claim 7, further comprising a cooling plate, and wherein the semiconductor device packages re mounted on the cooling plate.

15. The apparatus of claim 14, wherein first sides of the semiconductor device packages face the cooling plate and wherein second sides of the semiconductor device packages face the first bus.

16. The apparatus of claim 7, further comprising connection tabs extending perpendicularly from the first, second, third and fourth planar bus sections.

17. The apparatus of claim 16, further comprising at least one metal oxide varistor (MOV) disposed on the first, second and third buses and connected between ones of the connection tabs connected to the second terminals of the first group of semiconductor device packages and ones of the second terminals of the second group of semiconductor device packages.

18. The apparatus of claim 7, further comprising a plurality of metal oxide varistors (MOVs) disposed on the first, second and third buses and electrically connected between the second terminals of the first group of semiconductor device packages and the second terminals of the second group of semiconductor device packages.

* * * * *